us011466835B2

United States Patent
Revol et al.

(10) Patent No.: US 11,466,835 B2
(45) Date of Patent: Oct. 11, 2022

(54) OPTICAL ELEMENT FOR A MOTOR VEHICLE

(71) Applicant: VALEO VISION, Bobigny (FR)

(72) Inventors: Damien Revol, Bobigny (FR); Marc Brassier, Bobigny (FR)

(73) Assignee: VALEO VISION, Bobigny (FR)

(*) Notice: Subject to any disclaimer, the term of this patent is extended or adjusted under 35 U.S.C. 154(b) by 20 days.

(21) Appl. No.: 16/285,354

(22) Filed: Feb. 26, 2019

(65) Prior Publication Data

US 2019/0264889 A1 Aug. 29, 2019

(30) Foreign Application Priority Data

Feb. 26, 2018 (FR) .................................. 18 51639

(51) Int. Cl.
| | |
|---|---|
| F21S 45/00 | (2018.01) |
| C23C 16/02 | (2006.01) |
| C23C 16/50 | (2006.01) |
| G02B 27/00 | (2006.01) |
| G02B 1/18 | (2015.01) |
| B32B 3/30 | (2006.01) |
| C09D 5/16 | (2006.01) |

(52) U.S. Cl.
CPC .............. *F21S 45/00* (2018.01); *B32B 3/30* (2013.01); *C09D 5/1681* (2013.01); *C23C 16/0236* (2013.01); *C23C 16/50* (2013.01); *G02B 1/18* (2015.01); *G02B 27/0006* (2013.01); *Y10T 428/24355* (2015.01)

(58) Field of Classification Search
CPC .......... F21S 45/00; C09D 5/1681; B32B 3/30; G02B 1/18; G02B 27/0006; Y10T 428/24355
See application file for complete search history.

(56) References Cited

U.S. PATENT DOCUMENTS

| | | | |
|---|---|---|---|
| 4,541,881 A | 9/1985 | Sebastiano | |
| 6,103,363 A | 8/2000 | Boire et al. | |
| 6,326,079 B1 | 12/2001 | Philippe et al. | |
| 6,435,702 B1* | 8/2002 | Aikawa | B05D 7/02 |
| | | | 362/509 |
| 6,818,309 B1* | 11/2004 | Talpaert | C03C 17/22 |
| | | | 428/432 |
| 2001/0031365 A1* | 10/2001 | Anderson | G02B 1/18 |
| | | | 428/432 |

(Continued)

FOREIGN PATENT DOCUMENTS

| | | |
|---|---|---|
| EP | 0 117 512 A2 | 9/1984 |
| EP | 3 208 123 A1 | 8/2017 |

OTHER PUBLICATIONS

French Preliminary Search Report dated Oct. 16, 2018 in French Application 18 51639, filed on Feb. 26, 2018 (with English Translation of Categories of Cited Documents).

*Primary Examiner* — Nancy R Johnson

(74) *Attorney, Agent, or Firm* — Oblon, McClelland, Maier & Neustadt, L.L.P.

(57) ABSTRACT

An optical element, which is transparent, for a motor vehicle, including at least one transparent first layer containing a polymer material and at least one second layer including at least silicon, titanium and oxygen. The optical element has a surface roughness defined by a mean square deviation Rq greater than or equal to 20 nm.

13 Claims, 1 Drawing Sheet

(56) References Cited

U.S. PATENT DOCUMENTS

| | | |
|---|---|---|
| 2002/0016250 A1* | 2/2002 | Hayakawa ............ G02B 1/105 |
| | | 502/5 |
| 2002/0028361 A1 | 3/2002 | Boire et al. |
| 2002/0071956 A1 | 6/2002 | Boire et al. |
| 2002/0110638 A1 | 8/2002 | Boire et al. |
| 2002/0119307 A1 | 8/2002 | Boire et al. |
| 2002/0136934 A1 | 9/2002 | Boire et al. |
| 2002/0150681 A1 | 10/2002 | Boire et al. |
| 2003/0207028 A1 | 11/2003 | Boire et al. |
| 2004/0067339 A1* | 4/2004 | Gandon ............ B32B 17/10761 |
| | | 428/141 |
| 2004/0216487 A1 | 11/2004 | Boire et al. |
| 2007/0104922 A1* | 5/2007 | Zhai .................... C09D 139/00 |
| | | 428/141 |
| 2008/0292872 A1 | 11/2008 | Boire et al. |
| 2008/0311408 A1* | 12/2008 | Treadway ............ C08G 59/306 |
| | | 428/447 |
| 2009/0181256 A1* | 7/2009 | Sharma ............. G02B 27/0006 |
| | | 428/428 |
| 2014/0120341 A1* | 5/2014 | Kharchenko ........... C23C 14/06 |
| | | 428/312.6 |
| 2017/0259300 A1* | 9/2017 | Goh ...................... C03C 17/256 |
| 2018/0059291 A1* | 3/2018 | Li ........................ G03F 7/0002 |

* cited by examiner

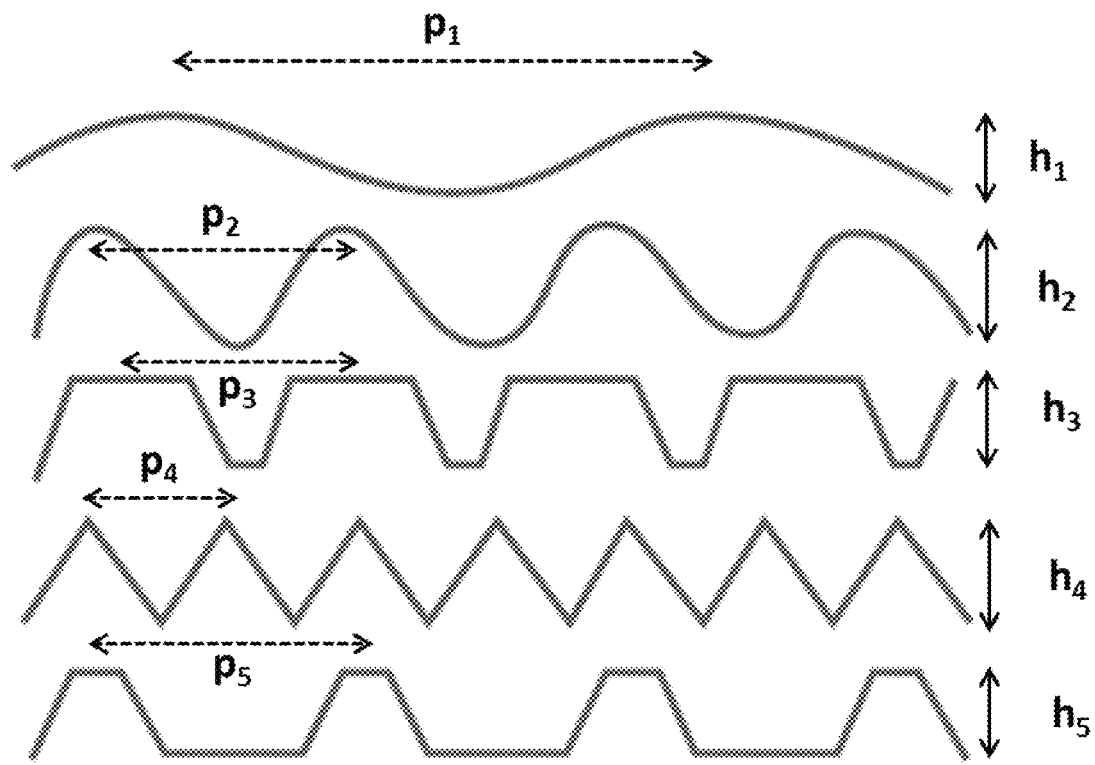

OPTICAL ELEMENT FOR A MOTOR VEHICLE

The present invention relates to an optical element, which is in particular transparent, for a motor vehicle, which has a surface roughness characterized by a square deviation of roughness Rq greater than or equal to 20 nm, to a motor vehicle luminous device comprising said optical element, and also to a process for manufacturing said optical element.

It typically, but not exclusively, applies to the fields of optics, such as for example luminous devices, in particular of the luminous signalling and/or lighting device type, in particular which can be used on the outside and/or on the inside of motor vehicles.

Luminous devices, such as for example a headlight or a rear light, typically comprise at least one optical element, which is in particular transparent, such as an inner lens, an outer lens, a lens, an external wall, an internal wall, a light guide, in particular for headlights, lights, cameras, or rear view mirrors. Such an optical element has the disadvantage of fogging up when the temperature of its surface descends below the dewpoint of the ambient air. The formation of fogging on its surface leads to a decrease in transparency, due to the scattering of light by the water droplets, which can cause a considerable inconvenience. Moreover, organic and mineral dirt can adhere to the transparent outer lens, making it difficult to clean and maintain.

To avoid the formation of fogging, that is to say the condensation of fine droplets of water on a support, and/or to obtain self-cleaning properties, it is known practice to deposit a superhydrophilic layer on a substrate. Thus, it is known practice to produce an anti-fogging and self-cleaning coating, in the form of a layer, comprising both titanium oxide and silicon oxide. The layer is obtained by combustion and/or pyrolysis of precursors of titanium oxide and of silicon oxide, in a flame, for example by flaming of the "flame spray pyrolysis" (FSP), "flame assisted spray pyrolysis" (FASP) or "liquid flame spray" (LFS) type. However, the cleaning properties are not optimized.

The aim of the present invention is to overcome the drawbacks of the prior art techniques by providing an optical element which is in particular transparent, for a motor vehicle, which has improved cleaning properties while at the same time guaranteeing good anti-fogging properties over time, in particular for a time of at least two years.

A first subject of the present invention is an optical element, which is in particular transparent, for a motor vehicle, comprising at least one transparent first layer containing a polymer material, and at least one second layer comprising at least silicon, titanium and oxygen, characterized in that the optical element has a surface roughness defined by a mean square deviation Rq greater than or equal to 20 nm.

By virtue of the invention, the optical element, in the operational configuration, has improved cleaning properties. In particular, the surface roughness conferred on the optical element makes it possible to reduce the adhesion of contaminants and dirt to the surface of said element while at the same time guaranteeing good anti-fogging properties. In addition, the optical element of the invention is easy to manufacture and guarantees uniform properties over the entire surface of said element.

In the present invention, the expression "transparent element or transparent layer" is intended to mean an element or a layer which transmits visible light by refraction and through which objects are visible with more or less clarity. More particularly, it is an element or a layer through which an image is observed without significant loss of contrast: the interposition of said transparent element or of said transparent layer between an image and an observer of said image does not significantly reduce the quality of the image. Indeed, for the purposes of the invention, a transparent element can transmit at least a portion of the incident light (or incident light ray) with very little or even no dispersion. Preferably, the light transmission, in particular the transmission of visible light, through the transparent element or transparent layer is at least approximately 87%. The light transmission is the amount of light which the transparent element or transparent layer allows to pass through from an incident light ray. The visible light transmission is the amount of visible light, corresponding to the electromagnetic waves of which the wavelength corresponds to the visible spectrum, that is to say between the wavelengths 380 and 780 nm approximately, that the transparent element or transparent layer allows to pass through from an incident light ray.

Roughness

The mean square deviation Rq which makes it possible to define the roughness of the optical element can be measured by means of a device with or without contact, such as a feeler profilometer, an optical profilometer, an optical section device or an atomic force device.

It is preferably measured by means of an atomic force device such as an Atomic Force Microscope (AFM).

The mean square deviation of roughness Rq is defined in the International Standard NF EN ISO 4287.

The optical element in accordance with the first subject of the invention preferably has a roughness defined by a mean square deviation of at least approximately 25 nm, preferably of at least approximately 50 nm and more preferably of at least approximately 100 nm.

The optical element in accordance with the invention advantageously has a nanometric roughness sufficient to induce a reduction of the adhesion of contaminants on the hydrophilic surface of the optical element, the hydrophilicity being conferred by the second layer comprising at least silicon, titanium and oxygen, of said optical element. Thus, the removal of organic and mineral dirt is thereby improved.

According to one particularly preferred embodiment of the invention, the mean square deviation is at most approximately 200 nm, and more preferably at most approximately 150 nm.

The roughness of the optical element can have a crenellated shape.

The crenellations can have a height ranging from approximately 100 to 200 nm.

Each of the crenellations can be at a distance ranging from approximately 50 to 500 nm from another adjacent crenellation. This distance is in particular referred to as the crenellation pitch.

The crenellations may be of the parallelepipedal (e.g. truncated pyramid), square, rectangular, triangular or sinusoidal type.

The Second Layer

By virtue of the second layer comprising at least silicon, titanium and oxygen, the optical element of the invention has in particular a photocatalytic activity.

The photocatalytic activity makes it possible to carry out chemical reactions in the presence of light. Its principle is based on the generation of electron-hole pairs in a semi-conductive material by absorption of photons of which the energy is at least equal to the bandgap of the material. These charge carriers will subsequently react with chemical species at the surface of the material, such as hydrocarbon residues originating from the exhaust gases of vehicles or contaminants, by oxidative photocatalysis. The photocatalysis leads to the breaking of the organic bonds of the residues or of the organic contaminants, and thus the degradation thereof. The elimination is carried out by entrainment of a condensed film of water and by natural convection of the luminous device.

According to one particularly preferred embodiment of the invention, the second layer also comprises at least one dopant chosen from the chemical elements of the Periodic Table of Elements which have an atomic size ranging from 1 to 4 Å.

The photocatalytic activity of the optical element of the invention can then be carried out at wavelengths λ ranging from 380 nm to 780 nm (visible light), and preferably at wavelengths λ greater than or equal to 400 nm.

The dopant makes it possible to partially replace the oxygen of the second layer.

The dopant may be chosen from nitrogen, carbon, sulfur, phosphorus, boron, fluorine, chlorine, iron, nickel, cobalt, chromium, vanadium, molybdenum, niobium, tungsten, platinum and aluminium.

According to one preferred embodiment of the invention, the dopant is nitrogen or carbon, and advantageously nitrogen.

The second layer of the optical element of the invention may comprise:
one or more silicon-oxygen (Si—O) group(s), and
one or more titanium-oxygen (Ti—O) group(s).

When the second layer also comprises a dopant, it may comprise one or more titanium-dopant group(s), and preferably one or more (Ti—N) or (Ti—C) group(s).

In the present invention:
the term "silicon-oxygen group" is intended to mean a group comprising at least one silicon atom covalently bonded to an oxygen atom (Si—O);
the term "titanium-oxygen group" is intended to mean a group comprising at least one titanium atom covalently bonded to an oxygen atom (Ti—O); and
the term "titanium-dopant group" is intended to mean a group comprising at least one titanium atom covalently bonded to a dopant atom (Ti-dopant).

The structure of the second layer can be analysed by SEM/EDS (Scanning Electron Microscopy/Energy Dispersive X-Ray Spectroscopy).

In one particular embodiment of the invention, when the dopant is nitrogen, the second layer comprises a nitrogenous derivative of titanium dioxide, and more particularly a nitrogen-doped titanium dioxide derivative.

Preferably, the nitrogenous derivative of titanium dioxide has the formula $TiO_{2-x}N_x$ with $0.001 < x < 1.00$, preferably with $0.01 \le x \le 0.10$, and more preferentially with $x=0.02$.

The second layer may also comprise silicon dioxide.

The second layer of the optical element of the invention may comprise approximately from 30% to 90% by weight of silicon, and preferably approximately from 40% to 70% by weight of silicon, relative to the total weight of the second layer.

The second layer of the optical element of the invention may comprise approximately from 1% to 70% by weight of titanium, and preferably approximately from 5% to 30% by weight of titanium, relative to the total weight of the second layer.

The second layer of the optical element of the invention may comprise approximately from 40% to 60% by weight of oxygen, and preferably approximately from 45% to 55% by weight of oxygen, relative to the total weight of the second layer.

The second layer of the optical element of the invention may comprise approximately from 0.0001% to 10% by weight of dopant, preferably approximately from 0.001% to 5% by weight of dopant, preferably approximately from 0.02% to 2% by weight of dopant, and preferably approximately from 0.01% to 0.1% by weight of dopant, relative to the total weight of the second layer.

The silicon/titanium weight ratio may preferentially range approximately from 70/30 to 90/10.

The determination of the various weight percentages indicated above can be conventionally carried out by elemental analysis spectroscopy, for example XPS (X-Ray Photoelectron Spectroscopy).

In the present invention, the second layer may be obtained from at least one precursor PR1 comprising oxygen and silicon and at least one precursor PR2 comprising oxygen and titanium.

The term "precursor" is intended to mean any compound, taken alone or in combination, which makes it possible to obtain the second layer.

More particularly, the precursor PR1 is chosen from a hydrocarbon silane, a fluorosilane, an organosilicate, a siloxane monomer, silicon dioxide ($SiO_2$), and a mixture thereof.

The hydrocarbon silane may be tetramethysilane (TMS).
The fluorosilane may be triethoxyfluorosilane (TEOF).
The organosilicate may be chosen from tetraethyl orthosilicate (TEOS), tetramethyl orthosilicate (TMOS), and a mixture thereof.

Said siloxane monomer may be chosen from hexamethyldisiloxane (HMDSO), tetramethyldisiloxane (TMDSO), octamethylcyclotetrasiloxane (OMCTSO), and a mixture thereof.

In the present invention, the precursor PR2 may be chosen from titanium tetraisopropoxide (TTIP), a derivative thereof, titanium diisopropoxide bis(acetylacetonate) (TIPO), tetrabutyl orthotitanate (TBOT), tetrapropyl orthotitanate (TPOT), ammonium citratoperoxotitanate, titanium tetrakis(9H-carbazol-9-ylethyloxy) ($Ti(OeCarb)_4$), titanium dioxide ($TiO_2$), and a mixture thereof.

As examples of TTIP derivatives, mention may be made of:
titanium acetylacetonate tris isopropoxide (TAATIP),
ethylene glycol-modified TTIP (EGMT), or
acetic acid-modified TTIP (AcOH/TTIP or $C_2H_4O_2$/TTIP).

The second layer may also comprise at least one non-metallic element, in particular chosen from carbon (C), phosphorus (P), fluorine (F) and sulfur (S), and/or at least one metallic element, in particular chosen from zinc (Zn), copper (Cu), silver (Ag), iron (Fe) and cobalt (Co).

The non-metallic element (respectively the metallic element) may be used as a co-dopant. The dopant as previously defined is then partly replaced in the second layer with at least the abovementioned non-metallic or metallic element.

The second layer of the invention may comprise approximately from 0.0001% to 10% by weight of metallic or non-metallic element, and preferably approximately from 0.01% to 2% by weight of metallic or non-metallic element, relative to the total weight of the second layer.

The combinations of a co-dopant with a dopant as defined above, such as the combination of fluorine (F) with nitrogen (N) or the combination of carbon (C) with nitrogen (N) are particularly suitable.

The second layer of the invention may also comprise one or more silicon-oxygen-hydrogen (Si—O—H) group(s) (silanol groups). This makes it possible to improve its hydrophilic nature and thus the anti-fogging and cleaning performance of the optical element, in particular by virtue of a promoted discharge of the mineral and organic dirt.

The second layer of the optical element according to the invention may have a thickness of at most approximately 100 nm, and preferably a thickness ranging approximately from 30 to 85 nm.

In one particularly preferred embodiment, the second layer is a hydrophilic layer, and more preferably a superhydrophilic layer.

In the present invention, the term "hydrophilic" is intended to mean a material or a layer of which the surface has a contact angle with water (or water drop angle) strictly less than 80°, and preferably greater than or equal to 10°. The term "superhydrophilic" is intended to mean more particularly a material of which the surface has a contact angle with water of less than 10°.

The optical element of the invention may have at least one surface which has a contact angle of less than 45°, preferably less than 20°, and more preferably less than 10°. This makes it possible to obtain an optical element which has good anti-fogging properties.

The measurement of the contact angle gives a picture of the ability of a liquid to spread on a surface by wettability. The method consists in measuring the angle of the tangent of the profile of a drop deposited on the material or the layer, with the surface of the material or of the layer.

This contact angle is typically measured by means of a goniometer, at 25° C., using distilled water.

In the present invention, the second layer may be deposited directly on the surface of the transparent first layer. In this respect, the second layer is directly in physical contact with the transparent first layer.

According to another embodiment, the second layer may be deposited indirectly on the surface of the transparent first layer. In this respect, one or more additional layer(s) may be inserted between the transparent first layer and the second layer comprising at least silicon, titanium and oxygen. Thus, the second layer is not directly in physical contact with the first layer.

Once the second layer comprising at least silicon, titanium and oxygen, and the additional layers, have been deposited on the transparent first layer, the colour of the first layer is visible through the second layer and the additional layers. The transparency of the second layer and of the additional layer is such that the colour of the first layer, seen through the second layer and the additional layers, is substantially the same as the colour of the first layer. The same colour means that the variation in the L*a*b parameters according to the CIELab method adheres in particular to the following values ΔL≤2.0, Δa≤1.0, Δb≤1.0, the L* parameter defining the clarity, the a* and b* parameters defining the chromaticity.

The Transparent First Layer

The optical element of the invention comprises one or more transparent first layer(s) made of a polymer material, or in other words, it comprises one or more transparent first layer(s) comprising a polymer material.

This transparent first layer may be referred to as substrate or support.

The transparent first layer may comprise at least approximately 50% by weight of polymer material, preferably at least approximately 60% by weight of polymer material, preferably at least approximately 80% by weight of polymer material, and particularly preferably at least approximately 95% by weight of polymer material, relative to the total weight of the first layer.

In one particular embodiment, the transparent first layer comprises only said polymer material.

The polymer material of the transparent first layer may comprise at least one polymer P chosen from a polycarbonate (PC), a high temperature modified polycarbonate (PC-HT), a poly(methyl methacrylate) (PMMA), a poly-N-methyl methacrylimide (PMMI), a cycloolefin polymer (COP), a cycloolefin copolymer (COC), a polysulfone (PSU), a polyarylate (PAR), a polyamide (PA), and a mixture thereof.

The polymer material may comprise at least approximately 50% by weight of the polymer P, preferably at least approximately 60% by weight of the polymer P, preferably at least approximately 80% by weight of the polymer P, and particularly preferably at least approximately 95% by weight of the polymer P, relative to the total weight of the polymer material.

In one particular embodiment, the polymer material comprises only one or more polymer(s) P.

The transparent first layer of the optical element in accordance with the invention may have a thickness of at least approximately 1.0 mm, and preferably of at least approximately 2.5 mm.

It may also have a thickness of at most approximately 5 mm, and preferably at most approximately 3.5 mm.

The polymer material (respectively the polymer P) preferably has a refractive index ranging from 1.3 to 1.7 approximately.

The polymer material of the transparent layer is transparent, in particular throughout the thickness in question of said layer.

According to the invention, the transparent first layer may also comprise at least one additive, which is in particular well known to those skilled in the art and which can be chosen from:
colouring agents such as pigments;
anti-UV agents;
protective agents such as antioxidants;
processing agents, such as plasticizers, lubricants, oils;
crosslinking agents, such as for example organic peroxides; and
a mixture thereof.

According to one particularly preferred embodiment of the invention, the transparent first layer and/or the second layer comprising silicon, oxygen and titanium is an etched layer.

Additional Layers

The optical element may also comprise a transparent layer of polyorganosiloxane.

The transparent layer of polyorganosiloxane may be obtained from at least one precursor PR3 chosen from a siloxane monomer and a silazane monomer.

By way of examples of siloxane monomer, mention may be made of hexamethyldisiloxane (HMDSO), tetramethyldisiloxane (TMDSO), octamethylcyclotetrasiloxane (OMCTSO), or a mixture thereof.

By way of example of silazane monomer, mention may be made of hexamethyldisilazane (HMDSN).

The transparent layer of polyorganosiloxane may have a thickness of at most approximately 500 nm, and preferably a thickness ranging from 10 to 50 nm approximately.

The transparent layer of polyorganosiloxane may be deposited directly on the transparent first layer. In this respect, the transparent layer of polyorganosiloxane is directly in physical contact with the transparent first layer.

In this embodiment, the transparent layer of polyorganosiloxane may be positioned between the transparent first layer and the second layer comprising silicon, oxygen and titanium. In this respect, the second layer comprising silicon, oxygen and titanium may be directly in physical contact with the transparent layer of polyorganosiloxane.

According to one particularly preferred embodiment of the invention, the transparent layer of polyorganosiloxane is an etched layer.

In one particular embodiment of the invention, at least any one of the transparent first layer, second layer comprising silicon, oxygen and titanium, and transparent layer of polyorganosiloxane is an etched layer.

The optical element of the invention in particular has anti-reflective properties.

The Optical Element

The optical element, which is in particular transparent, of the invention may be of the type such as an inner lens, an outer lens, a lens, an external wall, an internal wall, a light guide, in particular for headlights, lights, cameras, or rear view mirrors.

The optical element may be part of a luminous device of the motor vehicle luminous signalling and/or lighting device type.

More particularly, the optical element may be a closing outer lens of a luminous device, such as the outer lens of a headlight or the outer lens of a rear light of a motor vehicle.

The closing outer lens of a luminous device may comprise an inner face and an outer face, the outer face being the one which is directly in contact with the outside environment or, in other words, the layer directly exposed to outside attacks.

In one particularly preferred embodiment, the first layer of the optical element of the invention is the outer face of said closing outer lens, in the luminous device.

In addition, the second layer may be the inner face of said closing outer lens, in the luminous device.

A second subject of the invention relates to a motor vehicle luminous device comprising an optical element, which is in particular transparent, as defined in the first subject of the invention.

In particular, the device in accordance with the second subject comprises a housing forming a volume in which a light source and/or a light module may be housed, the optical element closing said housing.

In one particular embodiment said luminous device may be included in a motor vehicle.

The Process for Manufacturing the Optical Element

A third subject of the invention is a process for manufacturing an optical element in accordance with the first subject of the invention, characterized in that it comprises, starting from the transparent first layer, at least the following steps:
an oxidative etching step, and
a step of depositing the second layer comprising silicon, oxygen and titanium.

The optical element of the invention is easy to manufacture and guarantees uniform properties over the entire surface treated with the second layer comprising silicon, oxygen and titanium, and etched.

The transparent first layer and the second layer comprising silicon, oxygen and titanium are as defined in the first subject of the invention.

The etching step and the step of depositing the second layer are carried out starting from the transparent first layer. These steps may be carried out according to one of the following two alternatives A) and B):

A) etching, by oxidative etching, the transparent first layer, and
depositing the second layer comprising silicon, oxygen and titanium, on the transparent first layer etched in the preceding step,
or
B) depositing the second layer comprising silicon, oxygen and titanium, on the transparent first layer, and
etching, by oxidative etching, the second layer comprising silicon, oxygen and titanium deposited in the preceding step.

Alternative A is preferred.

Oxidative Etching Step

This etching step makes it possible to confer on the optical element a surface roughness defined by a mean square deviation Rq of at least 20 nm.

The oxidative etching step may be carried out by dry etching, in particular of the anisotropic type (i.e. anisotropic etching), and preferably of the reactive ion type.

According to one preferred embodiment of the invention, the oxidative etching step uses an oxidizing plasma, in particular comprising an oxidizing gas chosen from oxygen, air, nitrous oxide, nitrogen, tetrafluoromethane ($CF_4$), sulfur hexafluoride ($SF_6$) and a mixture thereof.

The oxidizing gas preferably comprises at least approximately 20 mol % of oxygen, and more preferably from 30 to 100 mol % approximately of oxygen, relative to the total number of moles of oxidizing gas.

Step of Depositing the Second Layer

The step of depositing the second layer comprising silicon, oxygen and titanium may be carried out by chemical vapour deposition (CVD), and preferably plasma-enhanced chemical vapour deposition. Plasma-enhanced chemical vapour deposition (PECVD) is well known for denoting processes referred to as "non-equilibrium".

PECVD deposition [with various sources: DC (direct current), LF (low frequency), MF (medium frequency), RF (radiofrequency), or microwaves] makes it possible to perform extremely crosslinked depositions at low temperatures, and is compatible with the polymers used in the optical element of the invention.

Plasma-enhanced chemical vapour deposition can be carried out under vacuum, more specifically under low pressure (of about from 1 to 10 Pa approximately, i.e. $10^{-2}$ to $10^{-1}$ mbar approximately), or under atmospheric pressure.

Mention may also be made of other types of CVD processes, such as for example laser-enhanced CVD deposition (LECVD).

Plasma deposition at atmospheric pressure is preferred.

The step of depositing the second layer by plasma-enhanced CVD can use a precursor PR1 as defined in the first subject of the invention, a precursor PR2 as defined in the first subject of the invention, a dopant such as nitrogen or a nitrogenous mixture, and an oxidizing carrier gas, such as air or oxygen.

When the step of depositing the second layer by plasma-enhanced CVD is carried out at atmospheric pressure, the values of the flow rates of the various components can vary within the following limits:
precursor PR1: from 0.001 $ml_s$/min to 10 $l_s$/min approximately;
precursor PR2: from 0.01 $ml_s$/min to 10 $l_s$/min approximately;
dopant (nitrogen or nitrogenous mixture): from 0.1 $ml_s$/min to 100 $l_s$/min approximately;
oxidizing carrier gas (air or oxygen): from 1 $ml_s$/min to 100 $l_s$/min approximately.

The unit ml$_s$/min signifies "millilitre standard per minute", and the unit l$_s$/min signifies "litre standard per minute", the standard conditions corresponding to a pressure of 1013 mbar and to a temperature of 20° C.

Optional Steps

The process may also comprise a step of depositing a transparent layer of polyorganosiloxane as defined in the first subject of the invention.

The depositing of this transparent layer of polyorganosiloxane is particularly suitable when alternative A) is implemented. In this embodiment, the step of depositing the transparent layer of polyorganosiloxane may then be carried out before the etching of the transparent first layer. This thus makes it possible to improve the protection of the transparent first layer which may be sensitive to the oxidizing conditions used during the subsequent etching step, in particular depending on the nature of the polymer material of said transparent first layer.

The depositing of this transparent layer of polyorganosiloxane may for example be suitable in the case where the transparent first layer comprises PMMA.

The depositing of the transparent layer of polyorganosiloxane may be carried out by plasma-enhanced chemical vapour deposition, in particular under vacuum, more specifically under low pressure (of about from 0.1 to 10 Pa approximately, i.e. $10^{-2}$ to $10^{-1}$ mbar approximately), or under atmospheric pressure.

The step of depositing the transparent layer of polyorganosiloxane by plasma-enhanced CVD may use a precursor PR3 as defined in the first subject of the invention and an oxidizing carrier gas such as air, nitrous oxide or oxygen.

When the step of depositing the transparent layer of the polyorganosiloxane is carried out by plasma-enhanced CVD at atmospheric pressure, the values of the flow rates of the various components can vary within the following limits:

precursor PR3: from 1 ml$_s$/min to 1 l$_s$/min approximately; and oxidizing carrier gas (air, nitrous oxide or oxygen): from 1 ml$_s$/min to 5 l$_s$/min approximately.

The process may also comprise a step of hydroxylation of the second layer comprising silicon, oxygen, titanium and optionally nitrogen.

This step makes it possible to hydrolyse the siloxane functions present in the second layer and to create silanol functions, and optionally Ti—OH functions, at the surface of this second layer. By virtue of this step, the hydrophilic nature of the second layer is increased, producing an improvement in the anti-fogging and cleaning properties.

The proportion of silanol Si—O—H functions relative to Si—O functions is generally 4/1 by mole.

This step is generally carried out after the step of depositing the second layer comprising silicon, oxygen and titanium, and generally before the etching if alternative B) is implemented.

The hydroxylation step may be carried out by plasma treatment at atmospheric pressure, in particular in the presence of a gas mixture of dinitrogen and of dioxygen, in particular in a volume ratio ranging from 3/1 to 5/1 (e.g. 4/1).

The process may also comprise a step subsequent to the hydroxylation step by plasma treatment in the presence of helium. This step makes it possible to block the hydroxyl functions of the silanol groups positioned externally on the surface of the optical element.

Other features and advantages of the present invention will emerge in the light of the description of non-limiting examples given only by way of non-limiting illustration, with reference to the appended FIG. 1.

FIG. 1 is a diagrammatic representation of examples of roughness of the optical element of the invention.

In the interests of clarity, only the elements essential for understanding the invention have been diagrammatically represented in this FIG. 1, which is not to scale.

In particular, in FIG. 1, several forms of crenellations are represented. The crenellations may be of the sinusoidal type having a height $h_1$ or $h_2$ and a pitch $p_1$ or $p_2$; of triangular type having a height $h_4$ and a pitch $p_4$; or of truncated pyramid type having a height $h_3$ or $h_5$ and a pitch $p_3$ or $p_5$.

EXAMPLE

Manufacture of an Optical Element in Accordance with the Invention

1. Step of Etching the Transparent First Layer

The support used as transparent first layer is a transparent polycarbonate (PC), sold by the company Kudeb under the reference Makrolon AL 2447. This support is in the shape of a rectangular plate with the following dimensions: 100 mm long, 100 mm wide and 2.5 mm thick.

The step of oxidative etching by atmospheric plasma oxidation is carried out on the transparent first layer.

The etching step is carried out on the support as described above by means of an atmospheric-pressure plasma torch comprising an internal electrode connected to a variable-frequency high-voltage generator and a nozzle for transferring the plasma to the support.

The ionization gas is dioxygen. The gas flow rate is 50 litres per minute. The frequency of the generator is set at 25 kHz, the applied voltage is set at 400 volts, the nozzle/source-to-support distance is 6 mm and the speed at which the nozzle moves relative to the support is 10 metres per minute.

An etched polycarbonate transparent first layer is thus obtained.

2. Step of Depositing the Second Layer Comprising Silicon, Oxygen and Titanium and a Dopant The step of depositing the second layer comprising silicon, oxygen, titanium and nitrogen as dopant, by means of an atmospheric plasma torch, is then carried out.

The following compounds are used to prepare the transparent second layer:

PR1: TEOS sold by the company Sigma Aldrich under the reference 86578 purity≥99% (CAS No. 78-10-4);

PR2: TIPP sold by the company Sigma Aldrich under the reference 87560 purity≥97% (CAS No. 546-68-9); and the nitrogen used as carrier gas, ionization gas and dopant: sold by the company Air Liquide under the reference Alphagaz 1 Azote (CAS No. 7727-37-9).

The TEOS/TIPP weight ratio is 80/20.

A generator supplies an internal electrode with a voltage ranging from 200 to 450 volts and a current ranging from 10 to 30 amps (frequency of 20-25 kHz).

The flow rate of the TEOS precursor PR1 is 8 l$_s$/min and the flow rate of the TIPP precursor PR2 is 2 l$_s$/min, and the flow rate of dopant gas (N$_2$) ranges from 10 to 30 l$_s$/min.

The frequency of the generator is set at 20 kHz, the applied voltage is set at 350 volts, the nozzle/source-to-support distance is 15 mm and the speed at which the nozzle moves relative to the support is 100 metres per minute. The temperature of the carrier gas is 200° C.

An optical element according to the invention comprising an etched polycarbonate transparent first layer covered with a second layer of silicon, titanium, oxygen and nitrogen is thus obtained.

The second layer has a thickness of approximately 20 nm.

This second layer is characterized by SEM/EDS (Scanning Electron Microscopy/Energy Dispersive X-Ray Spectroscopy). It comprises a structure of core/shell type, in which at least one $SiO_2$ particle is covered with a shell of $TiO_{2-x}N_x$ nanoparticles distributed at the surface of said $SiO_2$ particle.

3. Step of Hydroxylation of the Second Layer

The support is then subjected to a hydroxylation step by means of an atmospheric plasma torch. The ionization gas is a mixture of dinitrogen and dioxygen in a 4/1 volume ratio. The gas flow rate is 50 litres per minute. The generator frequency is set at 22 kHz, the applied voltage is set at 300 volts, the nozzle/source-to-support distance is 10 mm and the speed at which the nozzle moves relative to the support is 30 metres per minute.

4. Step of Plasma Treatment, in the Presence of Helium, of the Second Layer

The support is then subjected to a plasma treatment in the presence of helium. A generator supplies an internal electrode with a voltage of 300 volts, a current of 20 amps and a frequency of 25 kHz. The helium flow rate is from 20 to 50 $l_s$/min. The nozzle/source-to-support distance is 15 mm.

5. Characterization of the Optical Element in Accordance with the Invention 5. a. Characterization of the Anti-fogging Properties The anti-fogging properties were characterized by means of a test in which the optical element is exposed to water vapour by exposing it above a water bath heated to and maintained at a temperature of 78° C. (±10° C.). The optical element is positioned 20 cm above the level of the water until saturation of the exposed surface (runoff of the condensed water).

The optical element remains perfectly transparent to the eye. No loss of transmission was observed on the surface of the optical element, which makes it possible to show its anti-fogging properties.

5. b. Characterization of the Photocatalytic Properties

The photocatalytic activity is measured by exposing the surface of the optical element, as obtained above, to strictly visible light (400 nm≤λ≤800 nm).

To do this, the optical element is placed in Petri dishes containing a solution of methylene blue (organic coloured indicator). The Petri dishes are then placed in an opaque chamber with an opening in its upper part made with a visible-bandpass filter (400 nm<λ<800 nm) above which is switched on a halogen lamp.

A decolouration of the methylene blue solution is visually observed in less than 30 minutes, which shows the photocatalytic effect in the visible range of the optical element in accordance with the invention.

5. c. Effect of Texturing/roughness

The roughness of the transparent polycarbonate (PC) support as described above (transparent first layer) was measured by means of an atomic force microscope.

Said support has a mean square deviation Rq of approximately 19.1 nm.

By comparison, the optical element as obtained at the end of step 2 described above has a mean square deviation Rq of approximately 65.2 nm.

The water contact angle is measured by means of a Krüss DSA 25 contact angle analyser according to the ASTM D 724-99 standard.

Said support has a water contact angle of 10°, while the contact angle of the optical element is less than 5°.

The support and the optical element are then stored at 23° C. without protection. After 28 days, said support has a water contact angle of 20°, while the contact angle of the optical element is 11°.

This makes it possible to show that the optical element of the invention has a superhydrophilicity which is maintained over time.

The invention claimed is:

1. Motor vehicle luminous device comprising:
   a housing forming a volume;
   at least one of a light source and a light module housed within the volume and configured to emit a light beam; and
   an optical element coupled to the housing such that it closes the housing, the optical element comprising:
   a transparent first layer containing only a polymer material comprising at least one polymer chosen from a poly-carbonate (PC), a high temperature modified polycarbonate (PC-HT), a poly(methyl methacrylate) (PMMA), a poly-N-methyl methacrylimide (PMMI), a cycloolefin polymer (COP), a cycloolefin copolymer (COC), a polysulfone (PSU), a polyarylate (PAR), a polyamide (PA), and a mixture thereof, wherein the transparent first layer is a substrate having a thickness of 1 mm to 5 mm and a uniformly etch treated surface comprising multiple peaks of deviating height from each other to form a surface roughness defined by a mean square deviation Rq greater than or equal to 20 nm and at most 200 nm, the uniformly etch treated surface being arranged in a path of the light beam of the light source; and
   a second layer formed on the uniformly etch treated surface of the substrate and comprising at least silicon, titanium and oxygen with a silicon/titanium weight ratio ranging from 70/30 to 90/10.

2. Optical element according to claim 1, wherein the second layer also comprises at least one dopant chosen from the chemical elements of the Periodic Table of Elements which have an atomic size ranging from 1 to 4 Å.

3. Optical element according to claim 2, wherein the second layer comprises from 0.0001% to 10% by weight of dopant, relative to the total weight of the second layer.

4. Optical element according to claim 2, wherein the optical element has a roughness defined by a mean square deviation of at least 50 nm.

5. Optical element according to claim 2, wherein the second layer of the optical element comprises:
   one or more silicon-oxygen (Si—O) group(s), and
   one or more titanium-oxygen (Ti—O) group(s).

6. Optical element according to claim 1, wherein the optical element has a roughness defined by a mean square deviation of at least 50 nm.

7. Optical element according to claim 6, wherein the second layer comprises from 0.0001% to 10% by weight of dopant, relative to the total weight of the second layer.

8. Optical element according to claim 1, wherein the second layer of the optical element comprises:
   one or more silicon-oxygen (Si—O) group(s), and
   one or more titanium-oxygen (Ti—O) group(s).

9. Optical element according to claim 8, wherein the second layer also comprises one or more silicon-oxygen-hydrogen (Si—O—H) group(s).

10. Optical element according to claim 1, wherein the optical element also comprises a transparent layer of polyorganosiloxane.

11. Optical element according to claim 10, wherein the transparent layer of polyorganosiloxane is positioned between the transparent first layer and the second layer comprising silicon, oxygen and titanium.

12. Optical element according to claim 1, wherein the etch treated surface is provided on one side of the transparent first layer and the second layer is provided in direct contact with the etch treated surface.

13. Motor vehicle luminous device according to claim 1, wherein the first layer faces an exterior of the housing and the second layer faces an interior of the housing.

* * * * *